United States Patent [19]

Kumada

[11] Patent Number: 5,118,966
[45] Date of Patent: Jun. 2, 1992

[54] DETECTION VOLTAGE OUTPUT CIRCUIT OF CHARGE GENERATION TYPE SENSING DEVICE

[75] Inventor: Akira Kumada, Yokohama, Japan

[73] Assignee: Murata Mfg. Co., Ltd., Kyoto, Japan

[21] Appl. No.: 725,900

[22] Filed: Jul. 3, 1991

Related U.S. Application Data

[63] Continuation of Ser. No. 616,733, Nov. 21, 1990, abandoned, which is a continuation of Ser. No. 348,991, May 8, 1989, abandoned.

Foreign Application Priority Data

May 12, 1988 [JP] Japan ................. 63-115392

[51] Int. Cl.⁵ .................. H03K 5/01; H03K 3/013
[52] U.S. Cl. ........................ 307/308; 307/261; 307/491; 307/494
[58] Field of Search ........... 307/308, 310, 311, 320, 307/261, 490, 494; 328/1, 2, 3, 6, 127

[56] References Cited

U.S. PATENT DOCUMENTS

| | | | |
|---|---|---|---|
| 4,274,056 | 6/1981 | Lukes et al. | 328/127 |
| 4,454,423 | 6/1984 | Koob | 328/127 |
| 4,496,858 | 1/1985 | Smith | 328/127 |

Primary Examiner—John Zazworsky
Attorney, Agent, or Firm—Koda and Androlia

[57] ABSTRACT

A detection voltage output circuit of a charge generation type sensing device outputs the charges generated on the sensing device in the form of a voltage. The detection voltage output circuit comprises: a sensing device composed of a dielectric for generating charges in accordance with a change in a physical quantity applied from the outside; a capacitor at a first stage which is connected in parallel to the sensing device and stores the charges generated on the sensing device; a capacitor at a second stage which stores the charges transferred from the capacitor at the first stage; a transfer switch which is provided between the capacitor at the first stage and the capacitor at the second stage so as to transfer the charges stored in the capacitor at the first stage to the capacitor at the second stage; an operational amplifier which is connected to the capacitor at the second stage so as to convert the charges stored in the capacitor at the second stage into a voltage and outputting the thus-obtained voltage; and an output switch which is connected to the output side of the operational amplifier so as to be turned off while at least a part of the charges stored in the capacitor at the first stage are transferred to the capacitor at the second stage and turned on after the transfer switch is turned off to output the voltage from the operational amplifier. The charges generated on the sensing device are output in the form of a voltage.

12 Claims, 7 Drawing Sheets

DETECTION VOLTAGE OUTPUT CIRCUIT OF CHARGE GENERATION TYPE SENSING DEVICE

This is a continuation of application Ser. No. 616,733, filed Nov. 21, 1990 which is a continuation of application Ser. No. 348,991, filed on May 8, 1989, now all abandoned.

BACKGROUND OF THE INVENTION

1. Field of the Invention

The present invention relates to a detection voltage output circuit of a charge generation type sensing device which converts the charges generated on the charge generation type sensing device due to a change in a physical quantity applied from the outside into a voltage and outputs the thus-obtained voltage.

2. Description of the Prior Art

It is generally known that some kinds of ferroelectric ceramic materials from among ceramic dielectrics, barium titanate ($BaTiO_3$) and lead zirconate titanate ($Pb_{1-x}Zr_xTiO_3$), for example, have both piezo-electricity and pyro-electricity. Charge generation type sensing devices (hereinunder referred to as "sensing devices") utilizing these piezo-electricity and pyro-electricity are utilized for various purposes as piezoelectric sensors and pyroelectric sensors.

For example, pyroelectric sensors are utilized as infrared sensors for detecting the infrared radiated from the human body, and an infrared sensor used as a human body detecting system such as that shown in FIG. 9 is known.

In FIG. 9, a sensing device 1 constitutes an infrared sensor for converting a minute temperature change caused by infrared into an electrical change. The detection current generated on the sensing device 1 is converted into a voltage by a current-voltage converter 2, and the voltage output from the current-voltage converter 2 is amplified by am amplifier 3. A low-pass filter 4 is provided at the subsequent stage to the amplifier 3 so as to remove the noise other than the detection signals received from the human body. The output from the low-pass filter 4 is compared with a reference voltage by a comparator 5. The reference numeral 6 denotes an output circuit composed of a digital circuit, a relay circuit and the like, and when the sensing device 1 detects the infrared radiated from the human body, the output circuit 6 supplies, for example, a visitor notice signal in accordance with the output from the comparator 5.

However, since the sensing device 1 generates charges when the spontaneous polarization of the pyroelectric changes due to a temperature change, the output current is as small as $10^{-11}$ to $10^{-13}$ A, so that in order to apply the sensing device 1 to a human body detecting system, it is necessary to convert a current into a voltage by using a resistance as high as $10^{11}$ to $10^{12}$ Ω for the current-voltage converter 2.

As such a current-voltage converter 2, a current-voltage converter 2A composed of a high resistor $R_H$ and an operational amplifier $2A_1$ the inverting input terminal of which is connected to the sensing device 1 so as to produce an output voltage $V_{out}$ from the output terminal, as shown in FIG. 10, is conventionally known. As another current-voltage converter 2, an impedance converter 2B composed of the high resistor $R_H$, a source resistor $R_S$ and a field-effect transistor $2B_1$ the gate of which is connected to the sensing device 1 so as to supply an output voltage $V_{out}$ based on the voltage between both terminals of the source resistor $R_S$ from a source S, as shown in FIG. 11, is also known.

However, both of the above-described current-voltage converters in the prior art have the following defects due to the use of the high resistor $R_H$ of $10^{11}$ to $10^{12}$ Ω.

Firstly, a delay in electrical response is generated due to the capacity components such as the capacity of the sensing device and the input capacity which an active element such as the operational amplifier $2A_1$ and the field-effect transistor $2B_1$ has and the stray capacity, and the high resistor $R_H$. Especially, since the high resistor $R_H$ has a resistance of $10^{11}$ to $10^{12}$ Ω, the time constant determined by the capacity components and the resistance is the order of 0.1 to 1 second, so that the responsiveness of the detecting system as a whole is deteriorated and the S/N of the signal obtained is lowered in the case of using the detecting system for the purposes other than the human body detection.

Secondly, in spite of the demand for a monolithic IC for the purpose of reduction in the size of a signal processing circuit and realization of a one-chip signal processing circuit, it is very difficult to produce a monolithic circuit in the prior art because the high resistor $R_H$ has a very high resistance.

Thirdly, since the high resistor $R_H$ has a very high resistance, it is difficult to reduce the deviation of resistance and there is a problem in the stability. Johnson noise produced by the high resistance is another problem.

On the other hand, a charge generation type sensing device intrinsically acts when an external force or external heat is applied thereto, so that noise is apt to be caused by a temperature change, vibration, etc. in the ambience, the noise containing various kinds of frequency components. In order to prevent malfunction caused by such noise and enhance the reliability, some known sensing devices are composed of a plurality of sensing devices, as shown in FIGS. 12 to 14.

The sensing device shown in FIG. 12 is composed of sensing devices 1A, 1A' which are connected with each other in series so as to have the opposite polarities and are connected to the impedance converter 2B. The sensing device shown in FIG. 13 is composed of sensing devices 1B, 1B' which are connected with each other in parallel so as to have the opposite polarities and are connected to the impedance converter 2B. Such structures can enhance the reliability to a certain extent, but the effect on the noise signals produced on the sensing devices separately from each other is disadvantageously small.

In order to enhance the reliability with respect to noise, the sensing device shown in FIG. 14 is composed of two pairs of sensing devices 1B, 1B' connected to each other in parallel and opposition, each pair 1B, 1B' being connected to a current-voltage converter 2 independently of another pair, and the respective output voltages are supplied through an AND circuit 7. Such structure, however, is disadvantageous not only in that it is difficult to realize a monolithic IC of the current-voltage converter 2 but also in that the number of parts is so large as to result in rise in cost.

SUMMARY OF THE INVENTION

Accordingly, it is an object of the present invention to eliminate the above-described problems in the prior art and to provide a detection voltage output circuit of a charge generation type sensing device which enables the realization of a monolithic IC by abolishing a current-voltage converter using a high resistor and which is capable of improving the detecting accuracy.

To achieve this aim, the present invention provides a detection voltage output circuit of a charge generation type sensing device including a sensing device composed of a dielectric for generating charges in accordance with a change in a physical quantity applied from the outside, the detection voltage output circuit outputs a voltage obtained by converting the charges generated on the sensing device by a charge-voltage converter of a switched capacitor type.

The detection voltage output circuit according to the present invention comprises: a capacitor at a first stage which is connected in parallel to the sensing device and stores the charges generated on the sensing device; a capacitor at a second stage which stores the charges transferred from the capacitor at the first stage; a transfer switch which is provided between the capacitor at the first stage and the capacitor at the second stage so as to transfer the charges stored in the capacitor at the first stage to the capacitor at the second stage; an operational amplifier which is connected to the capacitor at the second stage so as to convert the charges stored in the capacitor at the second stage into a voltage and outputting the thus-obtained voltage; and an output switch which is connected to the output side of the operational amplifier so as to be turned off while at least a part of the charges stored in the capacitor at the first stage are transferred to the capacitor at the second stage and turned on after the transfer switch is turned off to output the voltage from the operational amplifier; whereby the charges generated on the sensing device are output in the form of a voltage.

The detection voltage output circuit of the present invention operates as follows The charges generated in accordance with a change in a physical quantity applied from the outside are stored in the capacitor at the first stage of the charge-voltage converter of a switched capacitor type, and the thus-stored charges are transferred to the capacitor at the second stage through the transfer switch. The charges transferred to the capacitor at the second stage are converted into a voltage by the operational amplifier, and the thus-obtained voltage is output through the output switch.

As described above, according to the present invention, it is possible to output the charges generated on the sensing device in the form of a voltage without using a current-voltage converter having a high resistor. It is therefore possible to enhance the responsiveness of the output voltage.

Since a high resistor is dispensed with, it is possible to realize a monolithic IC in the detection voltage output circuit.

In addition, since it is possible to shorten the outputting time in comparison with the detecting time, improvement of the detecting accuracy is enabled by eliminating the influence of a background noise containing a high-frequency component, and it is further possible to constitute the detection voltage output circuit as a switched capacitor filter.

The above and other objects, features and advantages of the present invention will become clear from the following description of the preferred embodiments thereof, taken in conjunction with the accompanying drawings.

DESCRIPTION OF THE PREFERRED EMBODIMENTS

Embodiments of the present invention will be explained in more detail with reference to FIGS. 1 to 8.

Figure 1:
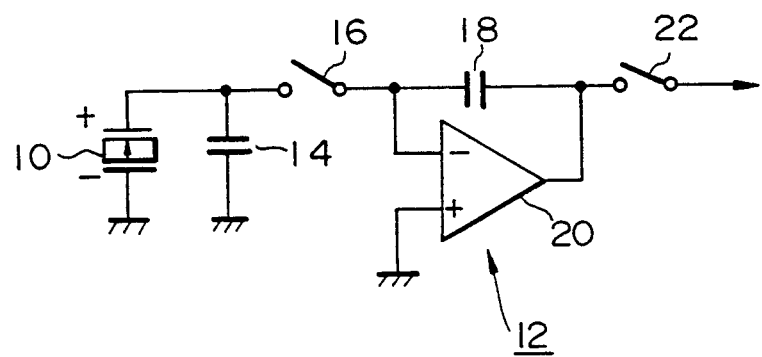
FIG. 1 is a circuit diagram of a first embodiment of a detection voltage output circuit of a charge generation type sensing device according to the present invention.

FIG. 1 shows the structure of a first embodiment of a detection voltage output circuit of a charge generation type sensing device according to the present invention. A detection voltage output circuit 12 is of a switched capacitor type.

More specifically, to a charge generation type sensing device 10 for generating charge $Q_{10}$ due to a change in a physical quantity applied from the outside, for example, the heat from infrared, a switched capacitor circuit 12 is connected. The switched capacitor circuit 12 incorporates a capacitor 14 at a first stage, a transfer switch 16, a capacitor 18 at a second stage, an operational amplifier 20 and an output switch 22.

The capacitor 14 at the first stage for storing the charges $Q_{10}$ generated on the sensing device 10 is connected to the sensing device 10, and the transfer switch 16 is connected to the capacitor 14 at the first stage. The transfer switch 16 is composed of, for example, an analog switch using a field-effect transistor, and when the transfer switch 16 is turned ON, the charges $Q_{10}$ stored in the capacitor 14 at the first stage are transferred to the capacitor 18 which will be described later.

The capacitor 18 at the second stage of the switched capacitor circuit 12 has a capacity $C_{18}$, and stores the charges $Q_{10}$ generated on the sensing sensor 10 when the transfer switch 16 is turned ON.

The capacitor 18 at the second stage is further connected to the inverting input terminal of the operational amplifier 20, while the noninverting input terminal of the operational amplifier 20 is connected to a signal ground. The operational amplifier 20 converts the transferred charges $Q_{10}$ into a voltage by using the capacitor 18 and produces a voltage output $V_{out}$.

The output switch 22, which is composed of an analog switch or the like similarly to the transfer switch 16 transfers the output voltage $V_{out}$ produced by the operational amplifier 20 to the circuit at the subsequent stage when the transfer switch 16 is turned ON.

In this embodiment, since the charge-voltage converter is composed of a switched capacitor circuit 12, it is unnecessary to use a high resistor as in the prior art, thereby realizing a detection voltage output circuit having a high responsiveness.

Since a high resistor is dispensed with, if a dielectric thin film is used as the sensing device 10, all of the switches 16, 22, the capacitors 14, 18 and the operational amplifier 20 can be constituted as an integrated circuit on a substrate, it is possible to realize a monolithic IC.

In addition, by appropriately selecting the sampling frequency, namely, by appropriately determining the sampling time Ts for the switched capacitor circuit 12, it is possible to realize a switched capacitor circuit having a frequency characteristic corresponding to the purpose of use.

Figure 2:
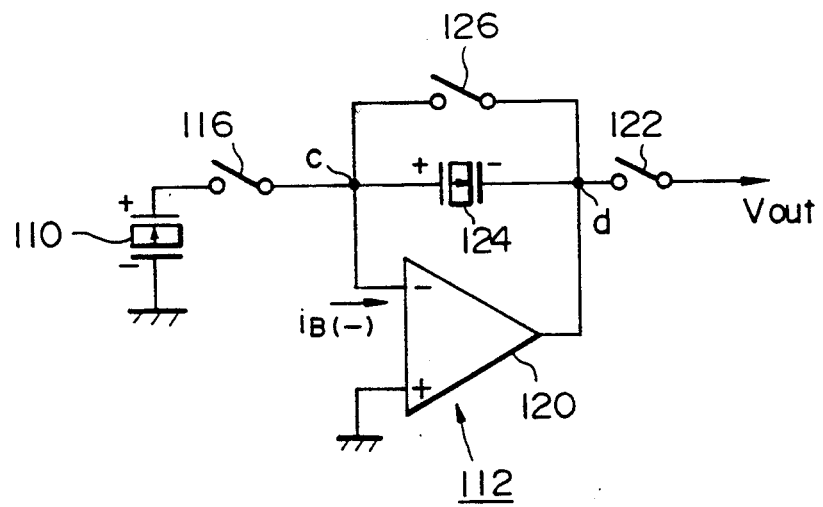
FIG. 2 is a circuit diagram of a second embodiment of a detection voltage output circuit according to the present invention, in which the electrostatic capacity of the sensing device is used as the capacitor at the first stage and a sensing device for correction and a reset switch are provided.
Figure 3:
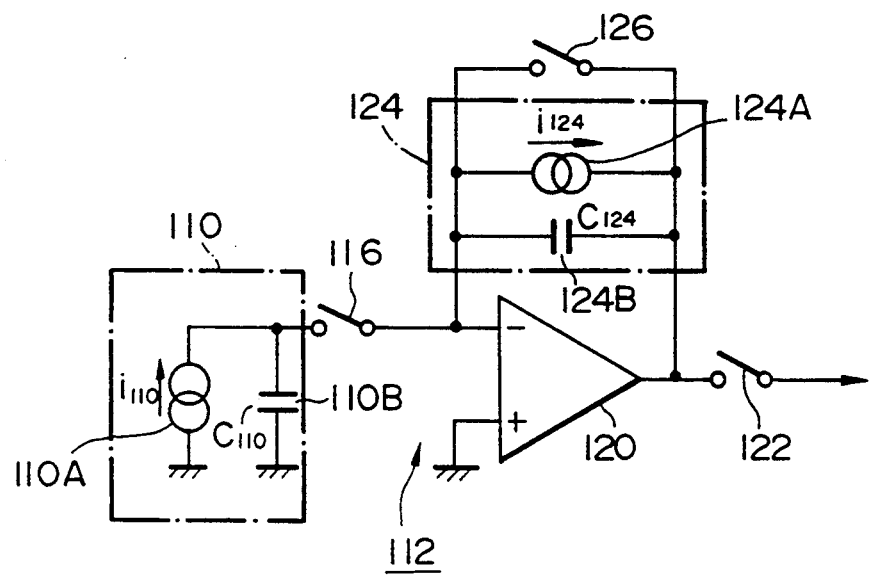
FIG. 3 is the equivalent circuit diagram of the second embodiment shown in FIG. 2.

FIG. 2 is a circuit diagram of a second embodiment of the present invention. The equivalent circuit thereof is shown in FIG. 3.

To a sensing device 110 having an electrostatic capacity of $C_{110}$ is connected a switched capacitor circuit 112, which incorporates a transfer switch 116, an operational amplifier 120, an output switch 122, a sensing device 124 for correction having an electrostatic capacity of $C_{124}$ and a reset switch 126.

The sensing device 110 is composed of a constant-current source 110A for current $i_{110}$ and a capacitor 110B having an electrostatic capacity of $C_{110}$, and charges $Q_{110}$ generated on the sensing device 110 due to a change in a physical quantity applied from the outside are stored in the capacitor 110B. That is, the capacitor 110B functions as the capacitor at the first stage of the switched capacitor circuit 112.

The sensing device 124 for correction is composed of a constant-current source 124A for current $i_{124}$ and a capacitor 124B having an electrostatic capacity of $C_{124}$, and charges $Q_{124}$ generated on the sensing device 124 for correction due to a background noise and the charges $Q_{110}$ transferred from the capacitor 110B are stored in the capacitor 124B. That is, the capacitor 124B functions as the capacitor at the second stage of the switched capacitor circuit 112.

The reset switch 126 is connected to the sensing device 124 for correction having the capacitor 124B. The reset switch 126 is composed of, for example, an analog switch and when the reset switch 126 is turned ON, a short-circuit is caused between the electrodes of the capacitor 124B, thereby discharging the stored charges.

The operation of this embodiment having the above-described structure will be explained with reference to FIG. 4.

Figure 4:
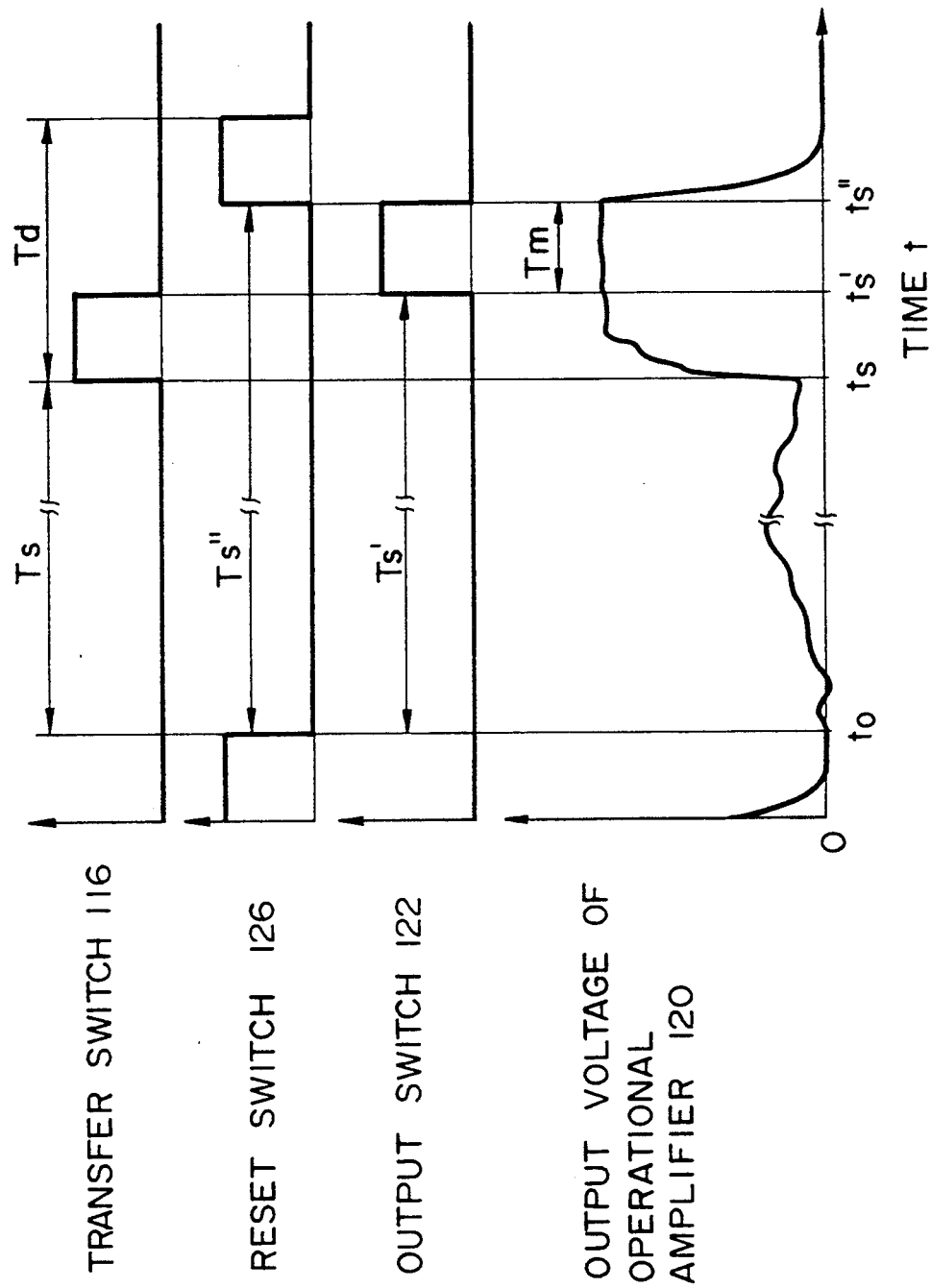
FIG. 4 shows the relationship between the switching operation timing and the output voltage in the second embodiment.

In FIG. 4, the symbol $t_0$ represents the time at which the reset switch 126 is turned OFF, $t_s$ the time at which the transfer switch 116 is turned ON, $t_s'$ the time at which the transfer switch 116 is turned OFF and the output switch 122 is turned ON, and $t_s''$ the time at which the output switch 122 is turned OFF and the reset switch 126 is turned ON.

The charges $Q_{110}$ stored in the sensing device 110 due to a change in a physical quantity applied from the outside during the period Ts from the time at which the reset switch 126 is turned OFF to the time at which the transfer switch 116 is turned ON, namely, when $t_0 \leq t \leq t_s$, are represented by the following formula (1):

$$Q_{110} = \int_0^{t_s} i_{110} dt \tag{1}$$

The charges $Q_{124}$ stored in the sensing device 124 due to a background noise during the period Ts' from the time at which the reset switch 126 is turned OFF to the time at which the output switch 122 is turned ON are represented by the following formula (2):

$$Q_{124} = \int_0^{t_s'} i_{124} dt \tag{2}$$

Since the sensing device 110 is not connected to the operational amplifier 120 during the period Ts in which the transfer switch 116 is OFF, the charges $Q_{110}$ represented by the formula (1) does not influence the output voltage $V_{out}$. On the other hand, since the sensing device 124 is constantly connected to the operational amplifier 120, the output voltage $V_{out}$ of the operational amplifier 120 changes in accordance with the charges $Q_{124}$ in such a manner as to have a characteristic exhibited when $t_0 \leq t \leq t_s''$ shown in FIG. 4 during the period $T_s''$ in which the reset switch 126 is OFF. When the transfer switch 116 is turned ON at the time ts, all the charges $Q_{110}$ stored in the sensing device 110 are transferred to the sensing device 124, and when the output switch 122 is turned ON at the time $t_s'$, the output voltage $V_{out}$ is supplied to the circuit at the subsequent stage.

The output voltage $V_{out}$ produced by the operational amplifier 120 during the period at which $t_0 \leq t \leq t_s''$ are represented as follows:

(a) When $t_0 \leq t \leq t_s$ (3)

$$V_{out} = \frac{1}{C_{124}} \times \int_{t_0}^{t} i_{124} dt$$

(b) When $t_s \leq t \leq t_s'$ (4)

$$V_{out} = \frac{1}{C_{124}} \times \int_{t_0}^{t} (i_{110} + i_{124}) dt$$

(c) When $t_s' \leq t \leq t_s''$ (5)

-continued $$V_{out} = \frac{1}{C_{124}} \times \int_{t_0}^{t_s'} (i_{110} + i_{124})dt + \int_{t_s'}^{t} i_{124}dt$$

The output voltage $V_{out}$ shows the characteristic as a whole such as that shown in FIG. 4.

In this embodiment, the sensing device 110 and the sensing device 124 (for correction) are connected with each other so as to have the opposite polarities with respect to the inverting input terminal of the operational amplifier 120. As a result, the charges produced on the sensing device 110 and the sensing device 124 for correction due to a change in a physical quantity such as an external heat and an external force are cancelled out by each other immediately after the transfer switch 116 is turned ON, so that even if the output switch is turned ON, no output voltage $V_{out}$ is generated.

In other words, in this embodiment, the output voltage $V_{out}$ is produced only when charges are generated on the sensing devices 110 and the sensing devices 124 for correction. Accordingly, if the sensing device 110 is so designed that a change in a physical quantity is applied from the outside only to the sensing device 110, it is possible to remove the noise voltage caused by the noise charges $Q_{110}$ produced on the sensing device 124 for correction due to a background noise by utilizing said noise charge $Q_{124}$, thereby enabling stable sensing operation.

It is also possible in this embodiment to exclude the influence of a background noise containing a high-frequency component and stabilize the output voltage $V_{out}$ transferred to the subsequent stage by sufficiently reducing the period Td during which $t_s \leq t \leq t_s''$ and the period Tm in which the output switch 122 is ON in comparison with the period Tm during which $t_0 \leq t \leq t_s$.

Figure 5:
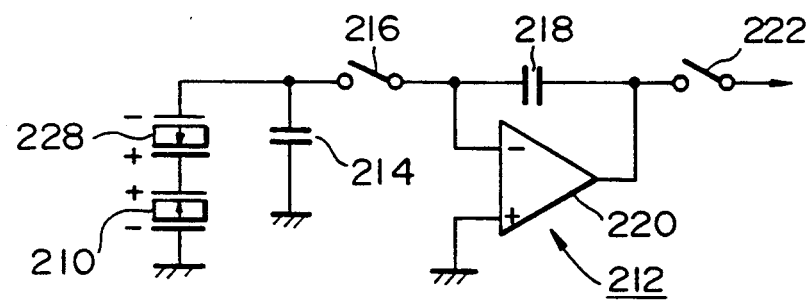
FIG. 5 is a circuit diagram of a third embodiment of a detection voltage output circuit according to the present invention which is provided with a sensing device for noise elimination.

FIG. 5 is a circuit diagram of a third embodiment of the present invention.

In this embodiment, a sensing device 228 for noise elimination which generates charges $Q_{228}$ and is composed of a charge generation type sensing device is provided. Since the sensing device 228 for noise elimination is provided in order to remove a noise, it is connected to the sensing device 210 in series and opposition so as to have the opposite polarities.

Charges $Q_{228}$ generated on the sensing device 228 for noise elimination due to a background noise together with charges $Q_{210}$ generated on the sensing device 210 due to a change in a physical quantity applied from the outside are stored in a capacitor 214 at a first stage and transferred to a capacitor 218 at a second stage through a transfer switch 216. That is, the capacitor 214 at the first stage and the transfer switch 216 also serve as a capacitor for noise elimination which stores the charges $Q_{228}$ and a transfer switch for noise elimination which transfers the charges $Q_{228}$ to the capacitor 218, respectively.

In this embodiment, the same effect as the first embodiment is obtained by carrying out a charge-voltage conversion by a switched capacitor circuit 212. In addition, since the sensing device 228 for noise elimination is provided, it is possible to remove noise charges and, hence, enhance the detecting accuracy.

Figure 6:
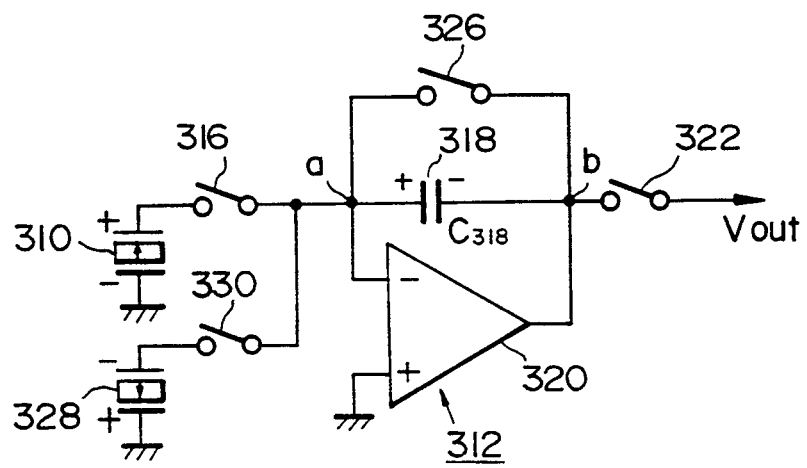
FIG. 6 is a circuit diagram of the structure of a fourth embodiment of a detection voltage output circuit according to the present invention which is provided with sensing devices for noise elimination which are connected in parallel and a reset switch.
Figure 7:
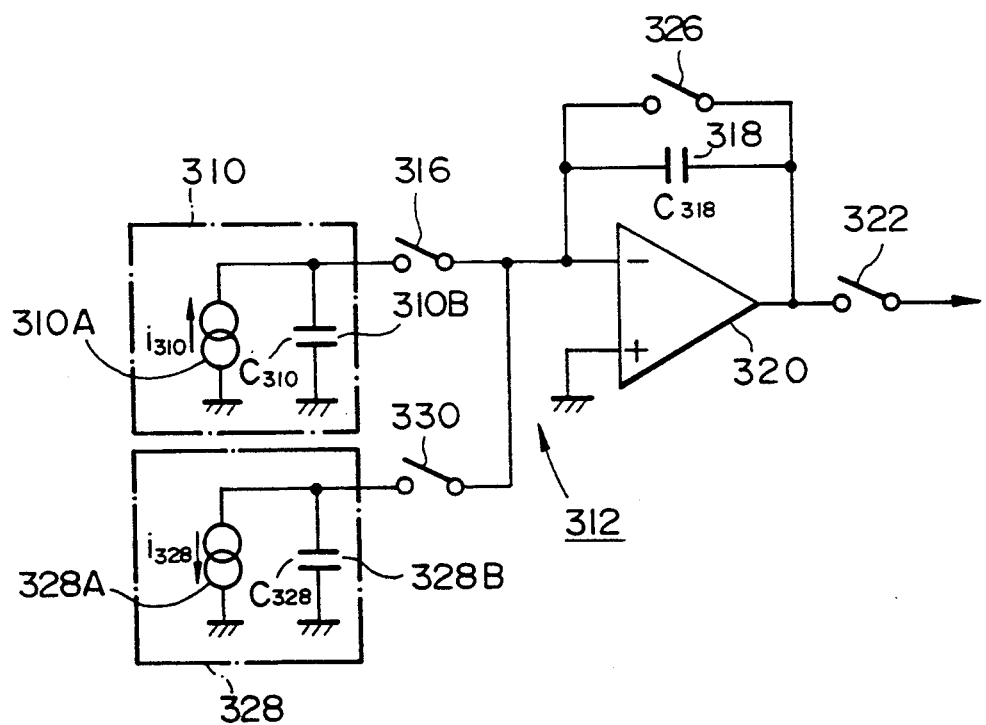
FIG. 7 shows the equivalent circuit of the fourth embodiment shown in FIG. 6.

FIG. 6 is a circuit diagram of a fourth embodiment of the present invention. The equivalent circuit thereof is shown in FIG. 7. In this embodiment, a sensing device 328 for noise elimination is connected to a sensing device 310 in parallel and opposition. The sensing device 328 for noise elimination removes the noise charges contained in charges $Q_{310}$ of the sensing device 310 in the same way as the sensing device 228 for noise elimination in the third embodiment.

The sensing device 310 generating the charges $Q_{310}$ in accordance with a change in a physical quantity applied from the outside is composed of a constant-current source 310A for current $i_{310}$ and a capacitor 310B constituting a capacity component $C_{310}$ for storing the charges $Q_{310}$, and the capacity component $C_{310}$ functions as a capacitor at the first stage of a switched capacitor circuit 312, as shown in the equivalent-circuit diagram of FIG. 7. To the sensing device 328 for noise elimination, a transfer switch 330 for noise elimination is connected and the transfer switch 330 is in turn connected to a capacitor 318 at a second stage. This embodiment is also provided with a reset switch 326.

Figure 8:
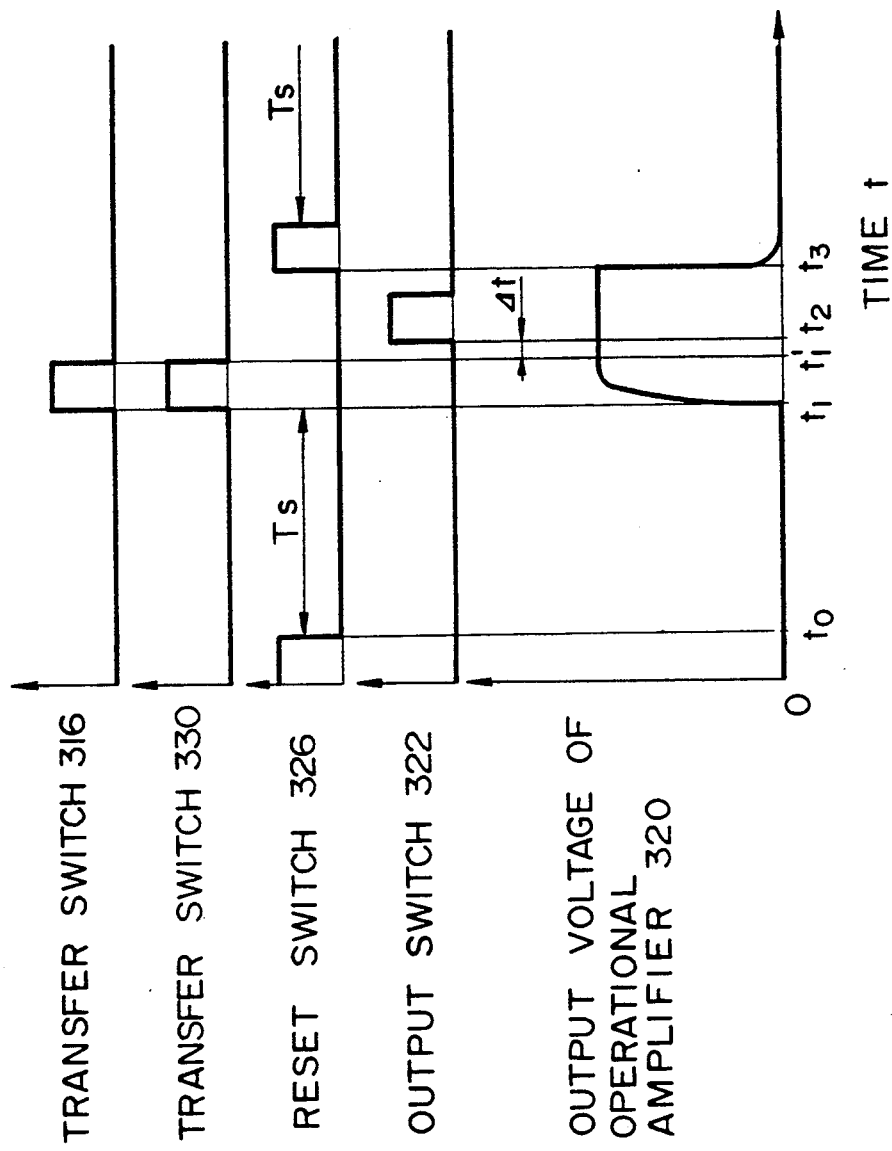
FIG. 8 shows the relationship between the switching operation timing and the output voltage in the fourth embodiment.
Figure 9:
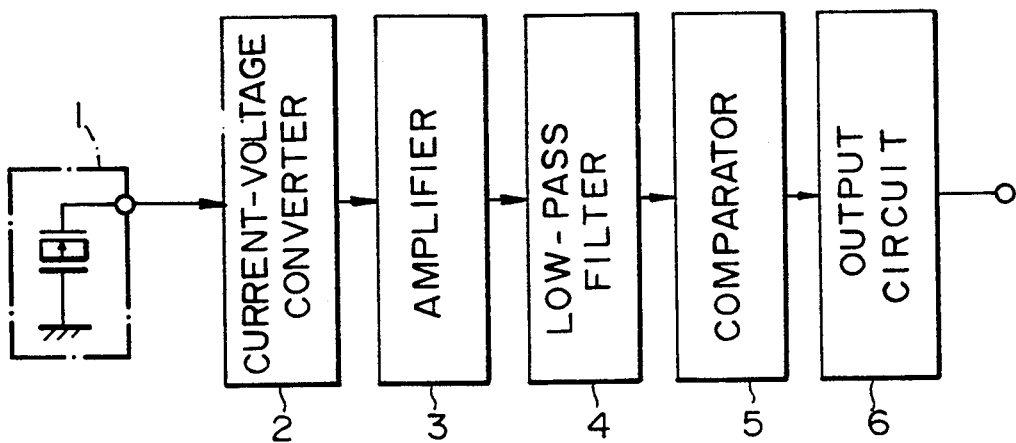
FIG. 9 is a block diagram of a conventional human body sensing system using a sensing device.
Figure 10:
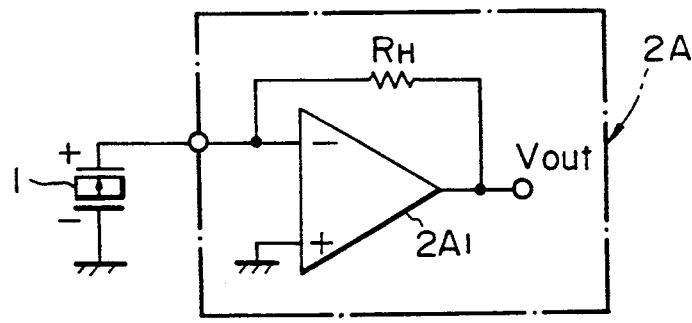
FIG. 10 is a circuit diagram of a current-voltage converter using a high resistor as the current-voltage converter in the conventional sensing system shown in FIG. 9.
Figure 11:
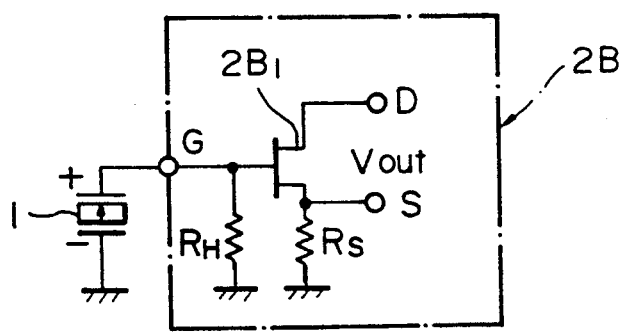
FIG. 11 is a circuit diagram of an impedance converter using a field-effect transistor as the current-voltage converter in the conventional sensing system shown in FIG. 9.
Figure 12:
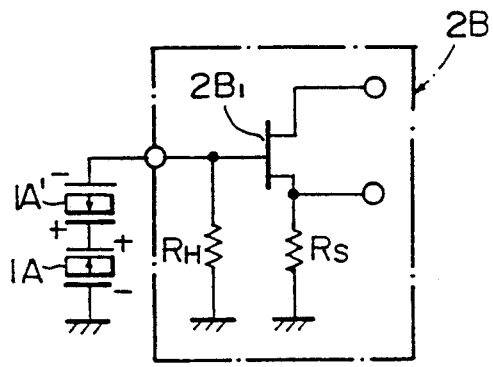
FIG. 12 is a circuit diagram of a conventional system shown in FIG. 11 in which a pair of sensing devices are connected in series and opposition.
Figure 13:
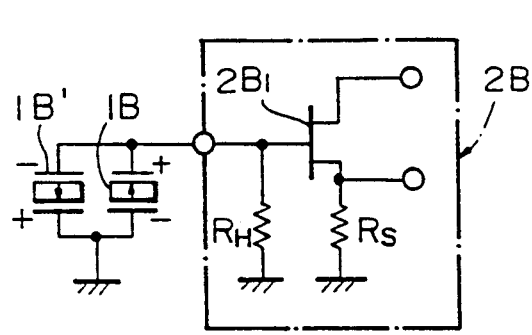
FIG. 13 is a circuit diagram of another modification of the conventional sensing system shown in FIG. 11 in which a pair of sensing devices are connected in parallel and opposition.
Figure 14:
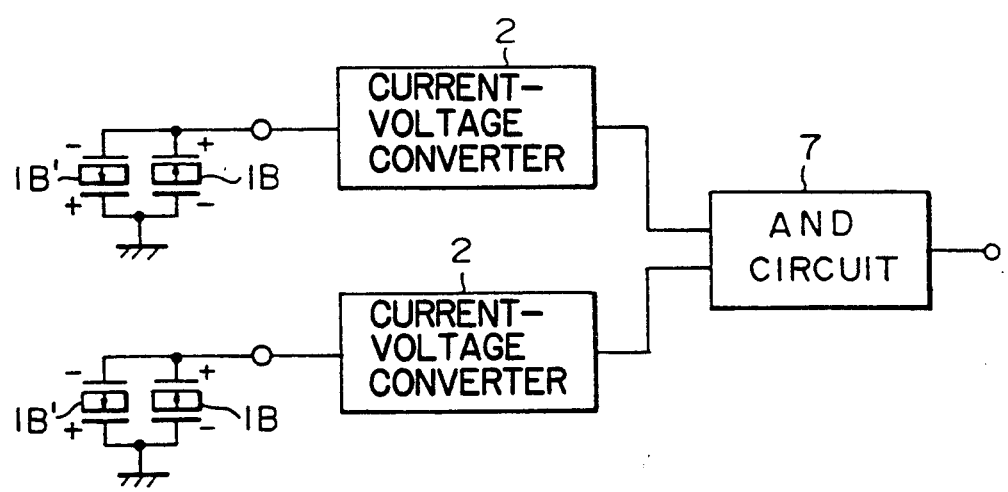
FIG. 14 is a block diagram of the structure of a conventional detection voltage output circuit having duplex sensing device and current-voltage converter.

The operation of this embodiment having the above-described structure will be explained with reference to FIG. 8.

The case in which the transfer switch 330 for noise elimination is OFF will first be explained.

During the period Ts from the time $t_0$ at which the reset switch 326 is turned OFF to the time $t_1$ at which the transfer switch 316 is turned ON, the charges $Q_{310}$ are stored in the sensing device 310 in accordance with a change in a physical quantity applied from the outside. During this time no charge is stored in the capacitor 318. This operation holds under the conditions that the reset switch 326 is ON until the time $t_0$, a short-circuit is caused between the electrodes of the capacitor 318, thereby discharging the charges to zero, an operational amplifier 320 is ideal, and no bias current flows.

When the transfer switch 316 is turned ON at the time $t_1$, all the charges $Q_{310}$ stored in the sensing device 310 are transferred to the capacitor 318 until the time $t_1'$ and is stored therein as represented by the following formula (6):

$$Q_{310} = \int_{t_1'(n-1)}^{t_1'(n)} i_{310}dt \tag{6}$$

wherein n represents one period of the ON/OFF of the switch 326. As a result, the charges are converted into a voltage so that the output voltage $V_{out}$ represented by the following formula (7) ate generated on the output terminal of the operational amplifier 320:

$$V_{out} = \frac{Q_{310}}{C_{318}} \tag{7}$$

When the output switch 322 is turned ON at the time $t_2$ at which the transfer of the charges $Q_{310}$ is completed, ($\Delta t$ after the transfer switch 316 is turned OFF), the output voltage $V_{out}$ is supplied to the circuit at the subsequent stage. After the output switch 322 is turned OFF, the reset switch 326 is turned On at the time $t_3$ to discharge the charges of the capacitor 318 to zero to initiate the subsequent cycle of operation.

In the above explanation, only the transfer switch 316 is ON, but it is also possible to turn both the transfer switches 316 and 330 simultaneously, or to subsequently turn on the transfer switches 316 and 330 before the output switch 322 is turned ON, and supply the output voltage $V_{out}$ represented by the following formula (8):

$$V_{out} = \frac{Q_{310} + Q_{328}}{C_{318}} \quad (8)$$

In this embodiment, the period Ts from the time when the reset switch 326 is turned OFF to the time when the output switch 322 is turned ON is much longer than the period during which the output switch 322 is ON. Therefore, the noise containing a high frequency component which has unexpectedly generated during the period Ts is averaged as a part of the charges $Q_{310}$ and $Q_{328}$, and since there is a very little probability of a noise generating during a minute period during which the output switch 322 is ON, it is possible to eliminate the influence of a noise containing a high-frequency component and constitute a detection voltage output circuit having high reliability, thereby enhancing the detecting accuracy.

In addition, since the capacity components $C_{310}$ and $C_{328}$ of the sensing devices 310 and 328 also serve as the capacitors at the first stage, namely, as a part of the switched capacitor circuit 312, the circuit structure is simplified.

Although, the operational amplifiers 20, 120, 220 and 320 are assumed to be ideal operational amplifiers in each embodiment, a bias current $i_B$ (−) flows on the inverting input terminal in actuality (see FIG. 2). However, since the output of the bias current $i_B$ (−) is supplied in the averaged state as represented by the following formula (9), it is easy to correct the output at the circuit at the subsequent step:

$$V_B = \frac{1}{C_{124}} \times \int_0^{t_s''} i_B(-)dt \quad (9)$$

It goes without saying that although the switches are represented by analog switches in the above embodiments, other switches may replace them.

As described in the above embodiments, according to the present invention, it is possible to provide a detection voltage outputting circuit of a charge generation type sensing device which uses a switched capacitor type charge-voltage converter. It is also possible to eliminate the influence of a background noise on a sensing device and hence, to improve, the detecting accuracy, as described in the third and fourth embodiments.

Thus, the present invention offers the following advantages.

1. Since a charge-voltage converter is composed of a switched capacitor circuit, the high resistor which is required in the prior art is dispensed with, and (1) it is possible to improve the responsiveness at the outputting time, (2) it is possible to realize a monolithic IC for the detection voltage circuit, and (3) since it is possible to shorten the outputting time in comparison with the detecting time, improvement of the detecting accuracy by eliminating the influence of a background noise containing a high-frequency component is enabled, and it is further possible to constitute the detected voltage outputting circuit as a switched capacitor filter.

2. It is possible to simplify the circuit structure by using the electrostatic capacity of a sensing device or a sensing device for correction as a capacitor at a first or second stage of a switched capacitor circuit.

3. It is possible to remove or correct the noise charges caused by a background noise or a noise voltage converted from the noise charges and improve the detecting accuracy by providing a sensing device for noise elimination or a sensing device for correction.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A detection voltage output circuit of a charge generation type sensing device comprising:
   a first sensing device composed of a dielectric for generating charges in accordance with a change in a physical quantity applied from the outside;
   a capacitor at a first stage which is connected in parallel to said first sensing device and stores said charges generated on said first sensing device;
   a capacitor at a second stage which stores said charges transferred from said capacitor at the first stage;
   a transfer switch which is provided between said capacitor at the first stage and said capacitor at the second stage so as to transfer said charges stored in said capacitor at the first stage to said capacitor at the second stage;
   an operational amplifier having said capacitor at the second stage connected from an input to an output of said operational amplifier so that operational amplifier converts said charges stored in said capacitor at the second stage into a voltage and outputs said voltage obtained; and
   an output switch which is connected to the output of said operational amplifier so as to be turned off while at least a part of said charges stored in said capacitor at the first stage are transferred to said capacitor at the second stage and turned on after said transfer switch is turned off to output said voltage from said operational amplifier.

2. A detection voltage output circuit according to claim 1, further comprising a second sensing device for noise elimination connected in series with said first sensing device.

3. A detection voltage output circuit according to claim 1, further comprising:
   a second sensing device for noise elimination having an opposite polarity to a polarity of said first sensing device connected in parallel with said sensing device;

4. A detection voltage output circuit of a charge generation type sensing device comprising:
   a first sensing device composed of a dielectric for generating charges in accordance with a change in a physical quantity applied from the outside;
   a second sensing device composed of a dielectric for generating charges in accordance with a change in a physical quantity applied from the outside;
   an operational amplifier for converting said charges in said first and second sensing device into a voltage and outputs said voltage obtained;
   a transfer switch which is provided between said first sensing device and said second sensing device so as to transfer a charge in said first sensing device to said operational amplifier; and
   an output switch which is connected to the output of said operational amplifier so as to be turned off while at least a part of said charges in said first sensing device is transferred to said operational amplifier and turned on after said transfer switch is turned off to output said voltage from said operational amplifier.

5. A detection voltage output circuit according to claim 4, further comprising a reset switch which is connected in parallel to said second sensing device so as to discharge charges stored in said second sensing device.

6. A detection voltage output circuit according to claim 4, wherein said second sensing device generates charges in accordance with a background noise applied to said first sensing device.

7. A detection voltage output circuit according to claim 4, wherein said second sensing device is connected between an inverting input terminal and an output terminal of the operational amplifier.

8. A detection voltage output circuit of a charge generation type sensing device comprising:
- a first sensing device composed of a dielectric for generating charges in accordance with a change in a physical quantity applied form the outside;
- a capacitor which stores said charges transferred from said first sensing device and which is connected between an inverting input terminal and an output terminal of an operational amplifier;
- a first transfer switch which is provided between said first sensing device and said capacitor so as to transfer said charges in said sensing device to said capacitor;
- said operational amplifier which converts said charges in said capacitor into a voltage and outputs said voltage obtained; and
- an output switch which is connected to the output of said operational amplifier so as to be turned off while at least a part of said charges in said first sensing device is transferred to said capacitor and turned on after said transfer switch is turned off to output said voltage from said operational amplifier.

9. A detection voltage output circuit according to claim 8, further comprising a second sensing device for being connected in series with said first sensing device, said second sensing device connected with an opposite polarity to a polarity of said first sensing device.

10. A detection voltage output circuit according to claim 8, further comprising a second sensing device for being connected in parallel with said first sensing device.

11. A detection voltage output circuit according to claim 10, further comprising a second transfer switch which is provided between said second sensing device and said capacitor so as to transfer said charges in said second sensing device to said capacitor, said first and second sensing devices connected to an inverting input terminal of said operational amplifier through said first and second transfer switches with an opposite polarity.

12. A detection voltage output circuit according to claim 8, further comprising a reset switch which is connected in parallel to said capacitor so as to discharge said charges stored in said capacitor.

* * * * *